(12) United States Patent
Fan (10) Patent No.: US 9,781,855 B2
(45) Date of Patent: Oct. 3, 2017

(54) ELECTRONIC APPARATUS

(71) Applicant: XAVi Technologies Corp., New Taipei (TW)

(72) Inventor: Cheng-Ming Fan, New Taipei (TW)

(73) Assignee: XAVi Technologies Corp., New Taipei (TW)

( * ) Notice: Subject to any disclaimer, the term of this patent is extended or adjusted under 35 U.S.C. 154(b) by 0 days.

(21) Appl. No.: 15/133,242

(22) Filed: Apr. 20, 2016

(65) Prior Publication Data

US 2017/0223858 A1 Aug. 3, 2017

(30) Foreign Application Priority Data

Jan. 28, 2016 (TW) .............................. 105201319 U (51) Int. Cl.
*H05K 5/00* (2006.01)
*H05K 7/14* (2006.01)
*H05K 5/03* (2006.01)
*H01B 7/04* (2006.01)

(52) U.S. Cl.
CPC ............. *H05K 7/1427* (2013.01); *H01B 7/04* (2013.01); *H05K 5/03* (2013.01)

(58) Field of Classification Search
CPC ........... H05K 7/1427; H05K 5/03; H01B 7/04
USPC ......................................... 361/728–730, 752
See application file for complete search history.

(56) References Cited

U.S. PATENT DOCUMENTS 5,253,143 A * 10/1993 Klinger ................ H05K 5/0069
361/736
5,742,478 A * 4/1998 Wu ..................... H05K 7/20154
361/704
6,499,621 B1 * 12/2002 Yamaguchi ............ H02G 3/088
220/4.02
6,854,996 B2 * 2/2005 Yaworski ................. H01R 4/36
174/71 B
7,272,008 B2 * 9/2007 Hussaini ............... H02J 7/0042
361/601
7,878,855 B2 * 2/2011 Li ..................... H01R 13/65802
439/607.04
8,289,729 B2 * 10/2012 Lieberman ................ G06F 1/26
361/807
9,030,831 B2 * 5/2015 Chao ..................... H05K 5/0013
361/747
9,048,651 B2 * 6/2015 Turner ............... H01R 13/5816
9,198,308 B2 * 11/2015 Lebo ..................... H05K 5/0204
9,609,763 B2 * 3/2017 Gerst .................... H05K 5/0013

(Continued)

FOREIGN PATENT DOCUMENTS

CN 2262257 Y 9/1997
CN 2842692 Y 11/2006

*Primary Examiner* — Hung S Bui (74) *Attorney, Agent, or Firm* — CKC & Partners Co., Ltd.

(57) ABSTRACT

An electronic apparatus includes a first cover, a second cover, and a cable assembly. The second cover covers the first cover and has at least one first engaging portion. The cable assembly includes a cable body and a cover plate. The cover plate is sleeved onto the cable body and covers the first cover. The cover plate has at least one second, engaging portion. The first cover, the second cover, and the cover plate form an apparent surface of the electronic apparatus and form an accommodating space therein. The first engaging portion and the second engaging portion are engaged with each other in the accommodating space.

12 Claims, 5 Drawing Sheets

(56) References Cited

U.S. PATENT DOCUMENTS

| | | | |
|---|---|---|---|
| 2007/0285906 A1* | 12/2007 | Deverall | H02K 19/365 361/760 |
| 2010/0151732 A1* | 6/2010 | Xu | H01R 13/506 439/607.45 |

* cited by examiner

ELECTRONIC APPARATUS

RELATED APPLICATIONS

This application claims priority to Taiwan Application Serial Number 105201319, filed Jan. 28, 2016, which is herein incorporated by reference.

BACKGROUND

Technical Field

The present disclosure relates to an electronic apparatus, and more particularly, to an electronic apparatus with a cable.

Description of Related Art

Signal transmissions among electronic apparatuses or among an electrical system and its peripheral equipment are mostly implemented by connections of cable assemblies. A cable assembly mainly consists of a cable body constituted by several wires and a connection terminal connected to an end of the cable body. This kind of cable assembly is typically used for external connections, and the cable assembly is easily affected by external forces (e.g., a plugging force, a touching force, and etc.). In order to keep the integrity of the assembly structure of the cable assembly without being damaged by plugging and to increase its service life, a bendable jacket is molded at an end of the cable assembly utilizing strain relief, so as to utilize adhesive forces among plastic materials to prevent the cable body from departing from the bendable jacket caused by an axial force after being molded.

However, the use of the foregoing cable assembly has following disadvantages: (1) the limitation of the diameter of the cable body affects the size of the bendable jacket disposed on the cable body, so the volume of the cable assembly cannot be reduced; and (2) because the contacting surface of the bendable jacket and the cable body are in close connection by the adhesive forces among the plastic materials, the cable body may axially depart from the bendable jacket when a larger axial force is applied to the cable body or the cable body is forced for a long time.

Accordingly, how to provide an electronic apparatus with a cable to solve the aforementioned problems becomes an important issue to be solved by those in the industry.

SUMMARY

Accordingly, an aspect of the disclosure is to provide an electronic apparatus with a cable.

According to an embodiment of the disclosure, the electronic apparatus includes a first cover, a second cover, and a cable assembly. The second cover covers the first cover and has at least one first engaging portion. The cable assembly includes a cable body and a cover plate. The cover plate is sleeved onto the cable body and covers the first cover. The cover plate has at least one second engaging portion. The first cover, the second cover, and the cover plate form an apparent surface of the electronic apparatus and form an accommodating space therein. The first engaging portion and the second engaging portion are engaged with each other in the accommodating space.

In an embodiment of the disclosure, a hardness of the cover plate is smaller than a hardness of the first cover and/or a hardness of the second cover.

In an embodiment of the disclosure, the cover plate is a thermoplastic elastomer piece.

In an embodiment of the disclosure, the apparent surface has a corner. The first cover has a first opening and a second opening. The first opening and the second opening are communicated with the accommodating space and respectively connected to two sides of the corner. The second cover covers the first opening. The cover plate covers the second opening.

In an embodiment of the disclosure, the first engaging portion is a column. The second engaging portion is formed with a slot.

In an embodiment of the disclosure, the first opening and an entrance of the slot substantially face a same direction.

In an embodiment of the disclosure, the first cover has at least one rib portion located at the second opening. The rib portion and an inner wall of the first cover form a passing zone. The second engaging portion passes through the passing zone and is retained between the rib portion and the inner wall.

In an embodiment of the disclosure, the cable assembly further includes a wrapping portion and a clamping member. The wrapping portion is connected to the cover plate and wraps at least a part of the cable body. The clamping member clamps the wrapping portion and the cable body.

In an embodiment of the disclosure, the second cover has a blocking portion. The blocking portion is partially blocked between the cover plate and the clamping member.

In an embodiment of the disclosure, the electronic apparatus further includes a circuit board disposed in the accommodating space. The circuit board has a socket. The cable assembly further includes a plug connected to an end of the cable body. The plug is configured to plug into the socket.

Accordingly, the electronic apparatus of the disclosure integrates the cable body and the cover plate and forms the apparent surface by the first cover, the second cover, and the cover plate. Specifically, in order to prevent the cover plate from becoming seriously deformed while an axial force is applied to, engaging portions that can be engaged with each other are respectively disposed on the second cover and the cover plate. Furthermore, in order to prevent the cover plate from laterally moving relative to the first cover when the cable body is pulled by a lateral force, rib portions are disposed at the opening of the first cover configured to be covered by the cover plate, so as to retain the engaging portion on the cover plate by using the rib portions and the inner wall of the first cover. In addition, in order to prevent the cable body from departing from the cover plate while being pulled, the clamping member is used to clamp the wrapping portion connected to the cover plate and wrapping the cable body. Accordingly, no matter whichever direction a force may be applied, the cable assembly can prevent the cover plate from becoming deformed, so as to effectively keep the integrity of the apparent surface of the electronic apparatus, and the cable assembly is also not easily damaged.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
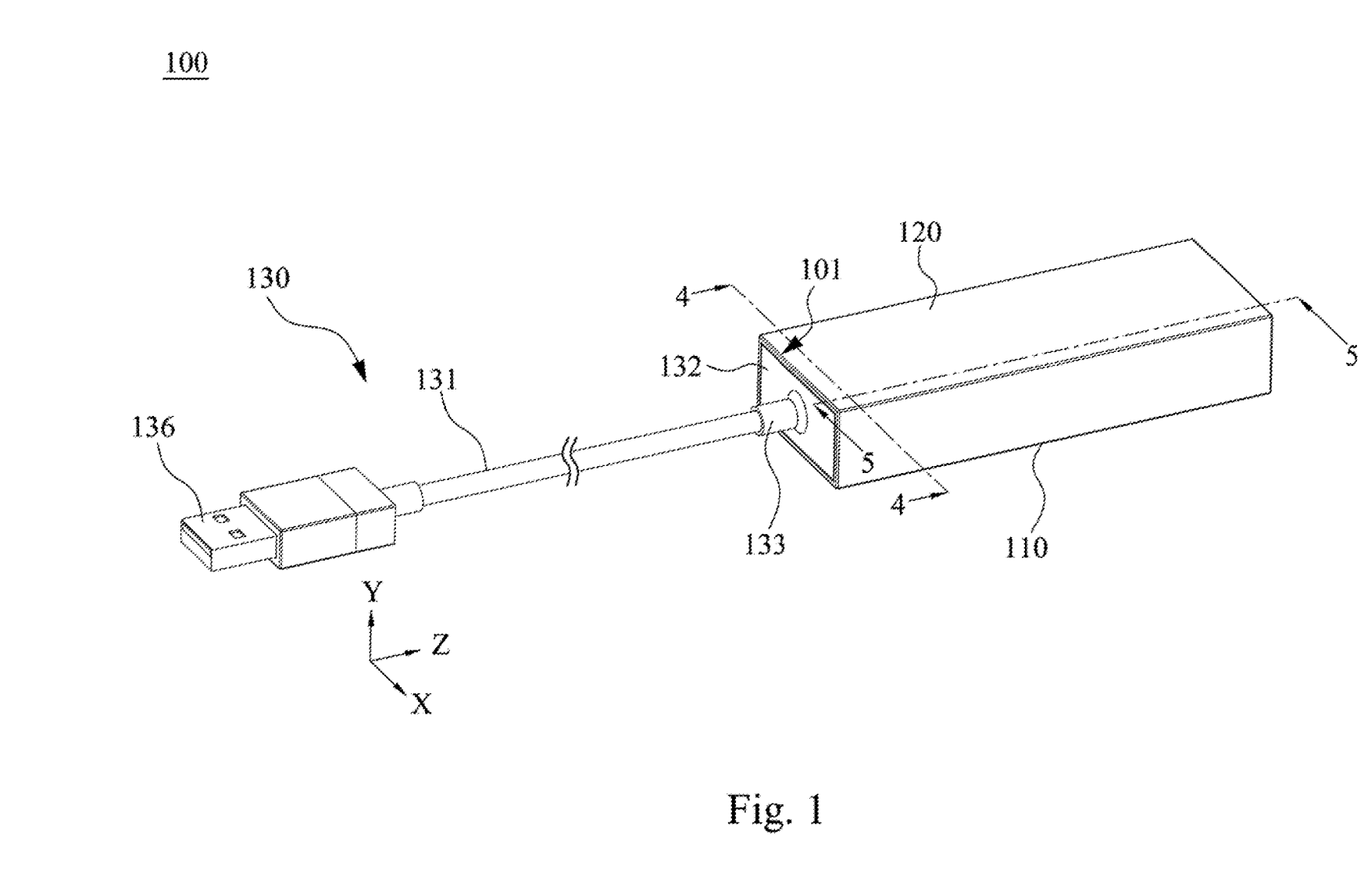
FIG. 1 is a perspective view of an electronic apparatus according to an embodiment of the disclosure.
Figure 2:
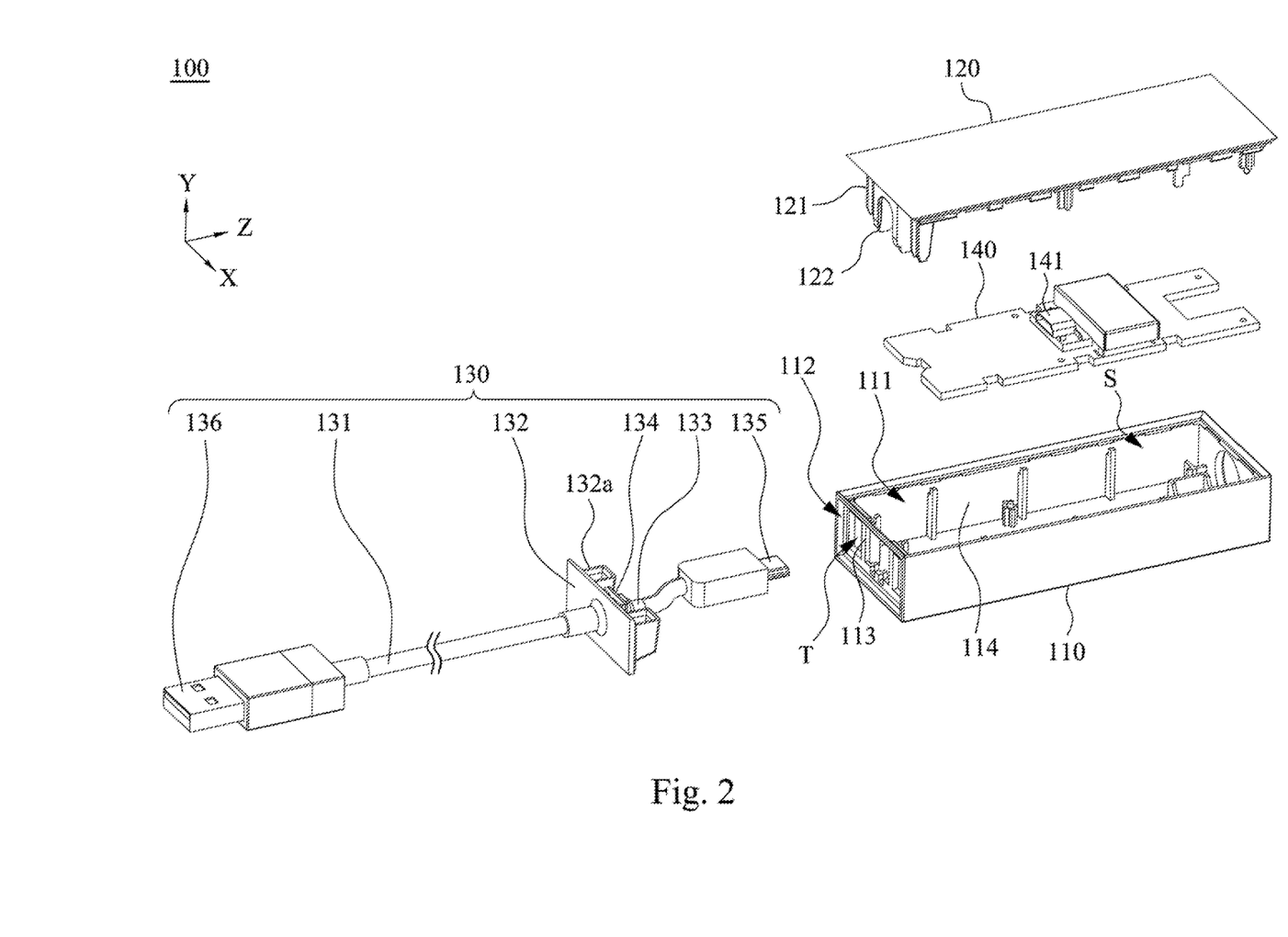
FIG. 2 is an exploded view of the electronic apparatus according to an embodiment of the disclosure.

Reference is made to FIG. 1 and FIG. 2. FIG. 1 is a perspective view of an electronic apparatus 100 according to an embodiment of the disclosure. FIG. 2 is an exploded view of the electronic apparatus 100 according to an embodiment of the disclosure. In some embodiments, the electronic apparatus 100 is a transformer, but the disclosure is not limited in this regard. Structures and functions of components included in the electronic apparatus 100 and connection relationships among the components are described in detail below.

As shown in FIG. 1 and FIG. 2, in the present embodiment, the electronic apparatus 100 includes a first cover 110, a second cover 120, and a cable assembly 130. The second cover 120 covers the first cover 110 and has at least one first engaging portion 121. The cable assembly 130 includes a cable body 131 and a cover plate 132. The cover plate 132 is sleeved onto the cable body 131 and covers the first cover 110. The cover plate 132 has at least one second engaging portion 132a. The first cover 110, the second cover 120, and the cover plate 132 form an apparent surface of the electronic apparatus 100 and form an accommodating space S therein. The first engaging portion 121 and the second engaging portion 132a are engaged with each other in the accommodating space S.

Specifically, the apparent surface of the electronic apparatus 100 has a corner 101 (as shown in FIG. 1). The first cover 110 has a first opening 111 and a second opening 112 (as shown in FIG. 2). The first opening 111 and the second opening 112 are communicated with the accommodating space S and respectively connected to two sides of the corner 101. The second cover 120 covers the first opening 111. The cover plate 132 covers the second opening 112.

Figure 3:
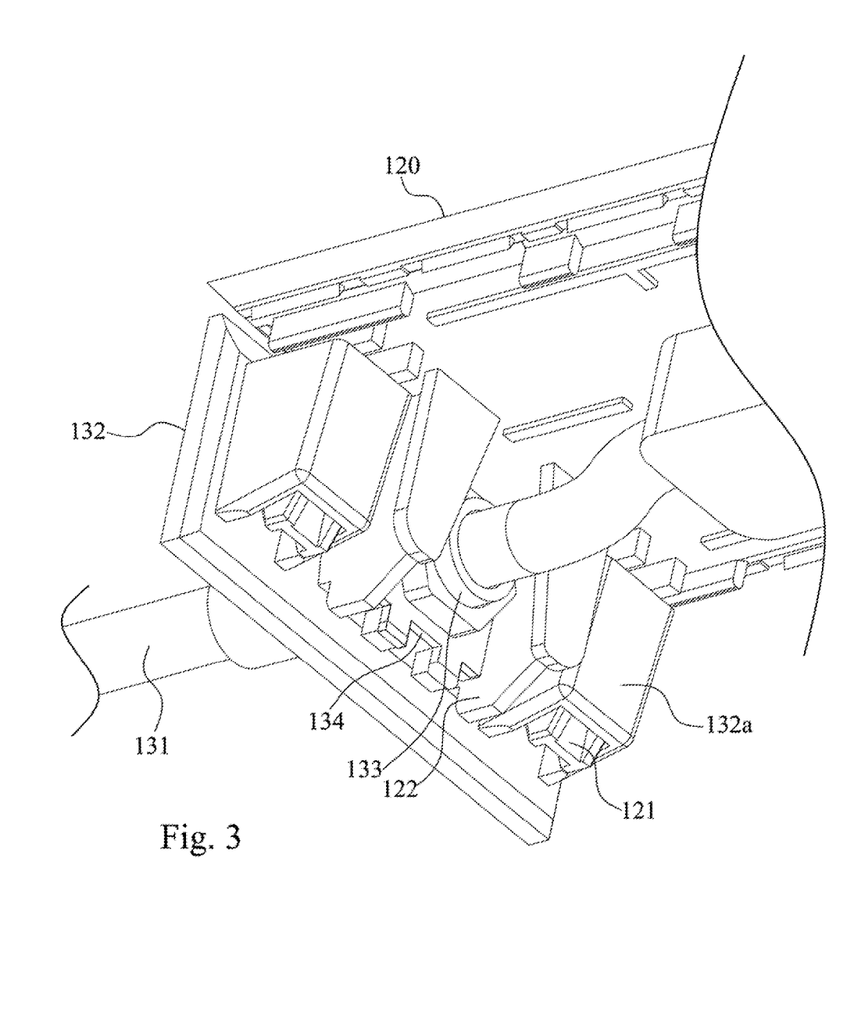
FIG. 3 is a partial perspective view of the electronic apparatus in accordance with FIG. 1 without a first cover.

Reference is made to FIG. 3. FIG. 3 is a partial perspective view of the electronic apparatus 100 in accordance with FIG. 1 without the first cover 110. As shown in FIG. 2 and FIG. 3, in the present embodiment, the first engaging portion 121 of the second cover 120 is a column, and the second engaging portion 132a of the cover plate 132 is formed with a slot. When the cover plate 132 covers the second opening 112 of the first cover 110, the first opening 111 and an entrance of the slot of the cover plate 132 substantially face a same direction. Hence, when the second cover 120 then covers the first opening 111 of the first cover 110, the column of the second cover 120 inserts into the slot of the cover plate 132. As a result, when the cable body 131 is pulled by an axial force (e.g., a force along the z-direction in FIG. 1) the engaged configuration of the column and the slot can prevent the cover plate 132 from becoming seriously deformed or even departing from the second opening 112.

In some embodiments, when the cover plate 132 covers the second opening 112 of the first cover 110, the second engaging portion 132a of the cover plate 132 is located proximal to the second opening 112 and extending toward the accommodating space S from the second opening 112 (e.g., along the z-direction in FIG. 1). In addition, the first engaging portion 121 of the second cover 120 is disposed at an end of the second cover 120. When the second cover 120 covers the first opening 111 of the first cover 110, the first engaging portion 121 is located proximal to the second opening 112 and extending toward the accommodating space S from the first opening 111 (e.g., along the y-direction in FIG. 1).

In some embodiments, a hardness of the cover plate 132 is smaller than a hardness of the first cover 110 and/or a hardness of the second cover 120. That is, the first cover 110 and/or the second cover 120 can be made of hard plastic materials, and the cover plate 132 can be made of soft plastic materials. For example, the first cover 110 and/or the second cover 120 can include hard polymer materials such as resin (e.g., ABS), polycarbonate (PC), and etc.; the cover plate 132 can be a thermoplastic elastomer piece and may include soft polymer materials such as polyvinyl chloride (PVC), but the disclosure is not limited in this regard.

In an alternative embodiment, the first engaging portion 121 of the second cover 120 can be formed with a slot, and the second engaging portion 132a of the cover plate 13 can be a column. When the cover plate 132 covers the second opening 112 of the first cover 110, the column of the cover plate 132 is extending toward the first opening 111. By following the foregoing assembly sequence of covering the cover plate 132 to the second opening 112 prior to covering the second cover 120 to the first opening 111, the column and the slot can also be engaged with each other in the accommodating space S.

In some embodiments, the assembled electronic apparatus 100 can includes two sets of combination of the first engaging portion 121 and the second engaging portion 132a engaged with each other, and these sets are respectively located at opposite sides of the cable body 131 in the accommodating space S, so that the cover plate 132 can uniformly carry the axial force when the cable body 1 is pulled by the axial force. The number of the sets of combination of the first engaging portion 121 and the second engaging portion 132a is not limited in this regard.

In some embodiments, after the second cover 120 and the cover plate 132 are respectively covered to the first opening 111 and the second opening 112 of the first cover 110, the second cover 120 and the cover plate 132 can be welded to the first cover 110 by using an ultrasonic welding technology, but the fixing method of these components is not limited in this regard.

Figure 4:
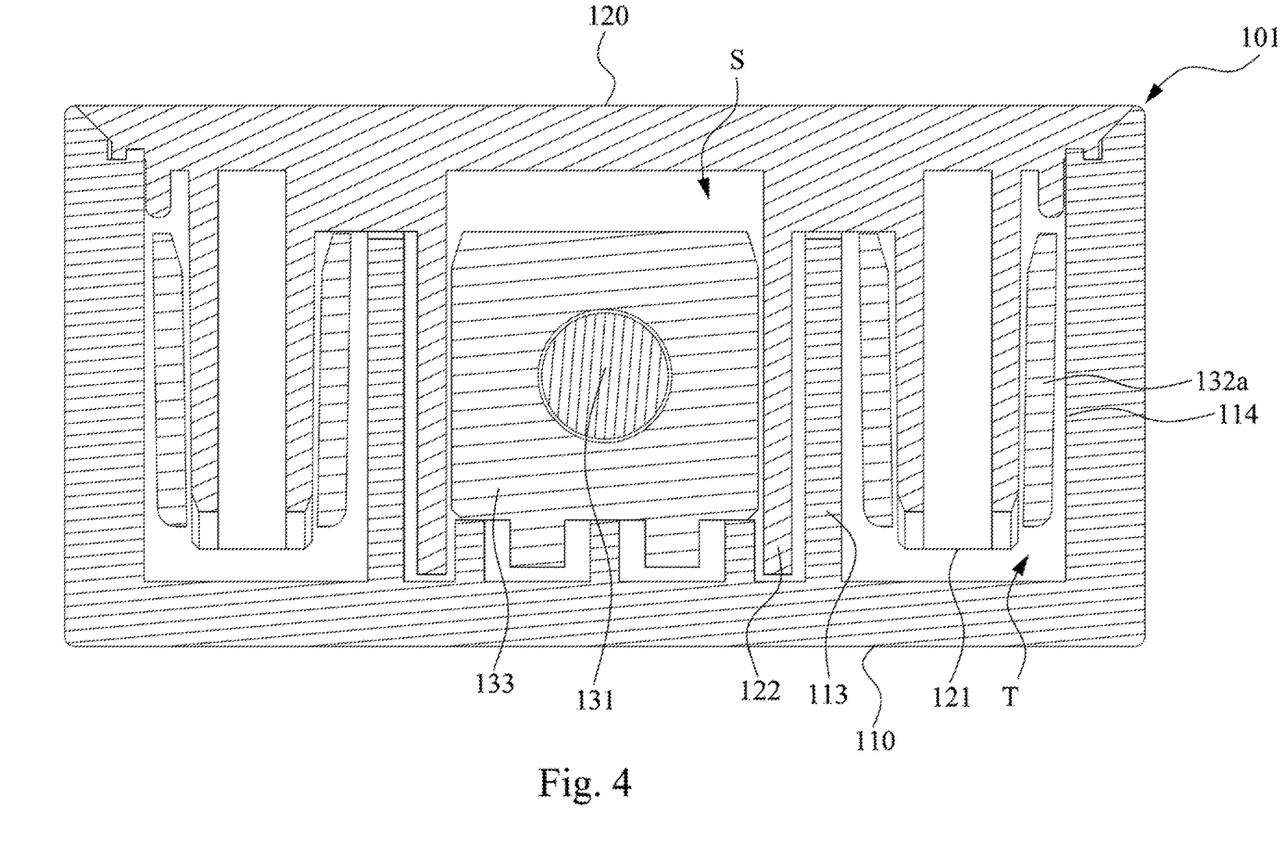
FIG. 4 is a cross-sectional view of the electronic apparatus taken along line 4-4 in FIG. 1.

Reference is made to FIG. 4. FIG. 4 is a cross-sectional view of the electronic apparatus 100 taken along line 4-4 in FIG. 1. As shown in FIG. 2 and FIG. 4, in the present embodiment, the first cover 110 has at least one rib portion 113 located at the second opening 112. The rib portion 113 and an inner wall 114 of the first cover 110 form a passing zone T. The second engaging portion 132a passes through the passing zone T and is retained between the rib portion 113 and the inner wall 114. Hence, when the cover plate 132 covers the second opening 112 of the first cover 110, the engaging portion (e.g. the second engaging portion 132a) on the cover plate 132 and the engaging portion (e.g. the first engaging portion 121) engaged with the cover plate 132 can be retained between the rib portion 113 and the inner wall 114 of the first cover 110, so as to prevent the cover plate 132 from laterally moving along a direction relative to the first cover 110 (e.g., along the x-direction in FIG. 1) when the cable body 131 is pulled by a lateral force. In addition, the portion of the inner wall 114 of the first cover 110 adjacent to the second opening 112 can be further used to retain the periphery of the cover plate 132, so as to prevent the cover plate 132 from laterally moving along another direction relative to the first cover 110 (e.g., aloe the y-direction in FIG. 1).

Figure 5:
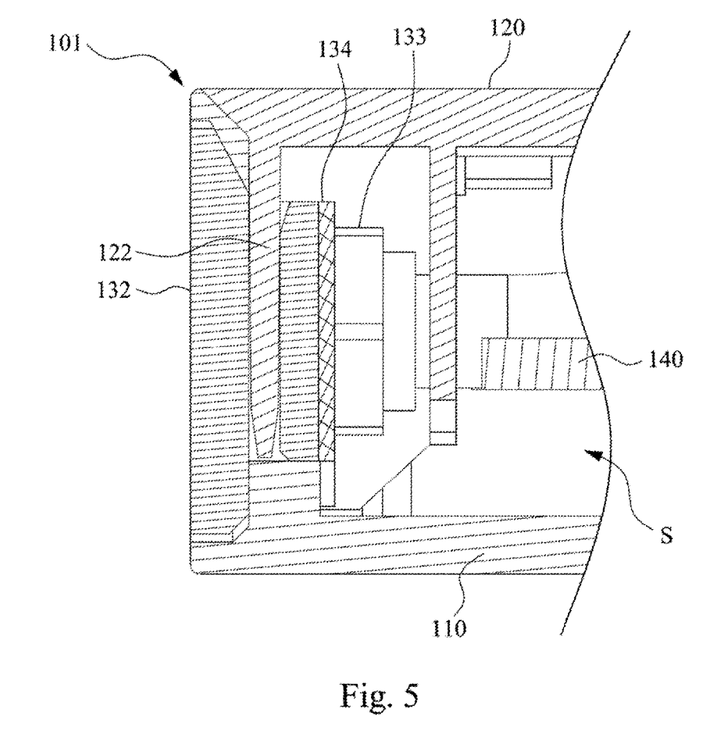
FIG. 5 is a cross-sectional view of the electronic apparatus taken along line 5-5 in FIG. 1.

Reference is made to FIG. 5. FIG. 5 is a cross-sectional view of the electronic apparatus 100 taken along line 5-5 in FIG. 1. As shown in FIG. 2 and FIG. 5, in the present embodiment, the cable assembly 130 further includes a wrapping portion 133 and a clamping member 134. The wrapping portion 133 is connected to the cover plate 132 and wraps a part of the cable body 131. The clamping member 134 clamps the wrapping portion 133 and the cable body 131. In some embodiments, the cover plate 132 and the wrapping portion 133 can be molded onto the cable body 131 by way of strain relief, but the disclosure is not limited in this regard.

By using the clamping member 134 to clamp the wrapping portion 133 and the cable body 131, the cable body 131 can be prevented from departing from the cover plate 132 while being pulled. That is, in addition to the adhesive forces among the plastic materials of the cable body 131 and the cover plate 132 (or the wrapping portion 133), the electronic apparatus 100 of the embodiment further fixes the cable body 131 and the cover plate 132 (or the wrapping portion 133) with the assistance of the clamping force provided by the clamping member 134.

In some embodiments, the clamping member 134 can be made of metal, but the disclosure is not limited in this regard.

As shown in FIG. 2 and FIG. 5, in the present embodiment, the second cover 120 further has a blocking portion 122. The blocking portion 122 is partially blocked between the cover plate 132 and the clamping member 134, so that the blocking portion 122 has the function of preventing the clamping member 134 from moving toward the cover plate 132. Hence, in addition to the engaged configuration of the first engaging portion 121 and the second engaging portion 132a, the blocking portion 122 can further provide assistance to prevent the cover plate 132 from becoming deformed when the cable body 131 is pulled by the axial force.

As shown in FIG. 2, in the present embodiment, the electronic apparatus 100 further includes a circuit board 140 disposed in the accommodating space S. The circuit board 140 has a socket 141. The cable assembly 130 further includes a plug 135 connected to an end of the cable body 131. The plug 135 is configured to plug into the socket 141. With the structural configurations of the combination of the first engaging portion 121 and the second engaging portion 132a and/or the combination of the clamping member 134 and the blocking portion 122, no matter being applied by forces in what directions, the cable assembly 130 of the electronic apparatus 100 of the disclosure can prevent the plug 135 from departing from the socket 141 and effectively keep the integrity of the apparent surface of the electronic apparatus 100, and the cable assembly 130 is also not easily damaged.

In the present embodiment, the cable assembly 130 further includes a connection terminal 136 connected to an end of the cable body 131 opposite to the plug 135. The connection terminal 136 is configured to connect other compatible electronic products. In some embodiments, the connection terminal 136 is a terminal with a USB (Universal Serial Bus) interface, but the disclosure is not limited in this regard.

According to the foregoing recitations of the embodiments of the disclosure, it can be seen that the electronic apparatus of the disclosure integrates the cable body and the cover plate and forms the apparent surface by the first cover, the second cover, and the cover plate. Specifically, in order to prevent the cover plate from becoming seriously deformed while an axial force is applied to, engaging portions that can be engaged with each other are respectively disposed on the second cover and the cover plate. Furthermore, in order to prevent the cover plate from laterally moving relative to the first cover when the cable body is pulled by a lateral force, rib portions are disposed at the opening of the first cover configured to be covered by the cover plate, so as to retain the engaging portion on the cover plate by using the rib portions and the inner wall of the first cover. In addition, in order to prevent the cable body from departing from the cover plate while being pulled, the clamping member is used to clamp the wrapping portion connected to the cover plate and wrapping the cable body. Accordingly, no matter whichever direction a force may be applied, the cable assembly can prevent the cover plate from becoming deformed, so as to effectively keep the integrity of the apparent surface of the electronic apparatus, and the cable assembly is also not easily damaged.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic apparatus, comprising:
   a first cover;
   a second cover covering the first cover and having at least one first engaging portion; and
   a cable assembly comprising:
   a cable body; and
   a cover plate sleeved onto the cable body and covering the first cover, wherein the cover plate has at least one second engaging portion,
   wherein the first cover, the second cover, and the cover plate form an apparent surface of the electronic apparatus and form an accommodating space therein, and the first engaging portion and the second engaging portion are engaged with each other in the accommodating space,
   wherein the apparent surface has a corner, the first cover has a first opening and a second opening, the first opening and the second opening are communicated with the accommodating space and respectively connected to two sides of the corner, the second cover covers the first opening, and the cover plate covers the second opening,
   wherein the first cover has at least one rib portion located at the second opening, the rib portion and an inner wall of the first cover form a passing zone, and the second engaging portion passes through the passing zone and is retained between the rib portion and the inner wall.

2. The electronic apparatus of claim 1, wherein a hardness of the cover plate is smaller than a hardness of the first cover and/or a hardness of the second cover.

3. The electronic apparatus of claim 1, wherein the cover plate is a thermoplastic elastomer piece.

4. The electronic apparatus of claim 1, wherein the first engaging portion is a column, and the second engaging portion is formed with a slot.

5. The electronic apparatus of claim 4, wherein the first opening and an entrance of the slot substantially face a same direction.

6. The electronic apparatus of claim 1, further comprising a circuit board disposed in the accommodating space, the circuit board having a socket, the cable assembly further comprising a plug connected to an end of the cable body, the plug being configured to plug into the socket.

7. An electronic apparatus, comprising:
a first cover;
a second cover covering the first cover and having at least one first engaging portion; and
a cable assembly comprising:
a cable body; and
a cover plate sleeved onto the cable body and covering the first cover, wherein the cover plate has at least one second engaging portion,
wherein the first cover, the second cover, and the cover plate form an apparent surface of the electronic apparatus and form an accommodating space therein, and the first engaging portion and the second engaging portion are engaged with each other in the accommodating space,
wherein the cable assembly further comprises a wrapping portion and a clamping member, the wrapping portion is connected to the cover plate and wraps at least a part of the cable body, and the clamping member clamps the wrapping portion and the cable body,
wherein the second cover has a blocking portion, and the blocking portion is partially blocked between the cover plate and the clamping member.

8. The electronic apparatus of claim 7, wherein a hardness of the cover plate is smaller than a hardness of the first cover and/or a hardness of the second cover.

9. The electronic apparatus of claim 7, wherein the cover plate is a thermoplastic elastomer piece.

10. The electronic apparatus of claim 7, wherein the first engaging portion is a column, and the second engaging portion is formed with a slot.

11. The electronic apparatus of claim 10, wherein the first opening and an entrance of the slot substantially face a same direction.

12. The electronic apparatus of claim 7, further comprising a circuit board disposed in the accommodating space, the circuit board having a socket, the cable assembly further comprising a plug connected to an end of the cable body, the plug being configured to plug into the socket.

* * * * *